US010147759B2

(12) United States Patent
Okada et al.

(10) Patent No.: US 10,147,759 B2
(45) Date of Patent: Dec. 4, 2018

(54) LED MODULE AND LED DOT MATRIX DISPLAY

(71) Applicant: ROHM CO., LTD., Kyoto-shi, Kyoto (JP)

(72) Inventors: Taisuke Okada, Kyoto (JP); Jun Mizuno, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 148 days.

(21) Appl. No.: 14/461,871

(22) Filed: Aug. 18, 2014

(65) Prior Publication Data

US 2014/0353697 A1 Dec. 4, 2014

Related U.S. Application Data

(63) Continuation of application No. 13/796,402, filed on Mar. 12, 2013, now Pat. No. 8,835,946, which is a continuation of application No. 12/668,803, filed as application No. PCT/JP2008/062566 on Jul. 11, 2008, now Pat. No. 8,421,093.

(30) Foreign Application Priority Data

Jul. 13, 2007 (JP) .................... 2007-184094
Jul. 13, 2007 (JP) .................... 2007-184095
Dec. 20, 2007 (JP) .................... 2007-328169

(51) Int. Cl.
| | |
|---|---|
| *H01L 27/15* | (2006.01) |
| *H01L 25/075* | (2006.01) |
| *H01L 33/54* | (2010.01) |
| *H01L 33/62* | (2010.01) |
| *H01L 33/48* | (2010.01) |

(52) U.S. Cl.
CPC .......... *H01L 27/15* (2013.01); *H01L 25/0753* (2013.01); *H01L 33/54* (2013.01); *H01L 33/62* (2013.01); *H01L 33/483* (2013.01); *H01L 33/486* (2013.01); *H01L 2224/45144* (2013.01); *H01L 2224/48227* (2013.01)

(58) Field of Classification Search
CPC .... H01L 33/0004–33/648; H01L 27/15; H01L 25/0753; H01L 2224/45144; H01L 2224/48227
See application file for complete search history.

(56) References Cited

U.S. PATENT DOCUMENTS 6,023,414 A * 2/2000 Fujii ................... G09F 9/302
257/88
6,297,598 B1 10/2001 Wang et al.
(Continued)

FOREIGN PATENT DOCUMENTS

JP 8-274379 10/1996
JP 2002-111065 4/2002
(Continued)

*Primary Examiner* — Cuong B Nguyen
(74) *Attorney, Agent, or Firm* — Hamre, Schumann, Mueller & Larson, P.C.

(57) ABSTRACT

An LED module A1 includes LED chips 3R, 3G, 3B, and a module substrate 1 on which the LED chips 3R, 3G, 3B are mounted. A wire 4R is connected to the LED chip 3R, and the LED chips 3G and 3B are arranged to face each other across the wire 4R. With this arrangement, the LED module A1 is reduced in size, and red light, green light and blue light are properly mixed.

48 Claims, 16 Drawing Sheets

(56) References Cited

U.S. PATENT DOCUMENTS

| | | |
|---|---|---|
| 6,306,684 B1 | 10/2001 | Richardson et al. |
| 2004/0159850 A1 | 8/2004 | Takenaka |
| 2004/0207313 A1* | 10/2004 | Omoto et al. ............... 313/503 |
| 2006/0157722 A1 | 7/2006 | Takezawa et al. |
| 2008/0099770 A1* | 5/2008 | Mendendorp ........... H01L 33/64 257/79 |
| 2008/0259598 A1* | 10/2008 | Sumitani et al. ............. 362/231 |
| 2010/0079997 A1* | 4/2010 | Morikawa ................ F21K 9/00 362/249.01 |

FOREIGN PATENT DOCUMENTS

| | | | | |
|---|---|---|---|---|
| JP | 2002-232014 | | 8/2002 | |
| JP | 2003-17753 | | 1/2003 | |
| JP | 2004-311456 | | 11/2004 | |
| JP | 2006-86408 | | 3/2006 | |
| JP | 2006-186297 | | 7/2006 | |
| JP | 2006-210734 | * | 8/2006 | ............ H01L 33/00 |
| JP | 2004-274027 | | 11/2006 | |
| JP | 2007-150080 | | 6/2007 | |
| WO | WO 2006/098561 | | 9/2006 | |

* cited by examiner

LED MODULE AND LED DOT MATRIX DISPLAY

This application is a Continuation of U.S. Ser. No. 13/796,402, filed Mar. 12, 2013, which is a Continuation of U.S. Ser. No. 12/668,803 filed Jan. 12, 2010, which is a National Stage Application of PCT/JP2008/062566, filed Jul. 11, 2008, which applications are incorporated herein by reference.

TECHNICAL FIELD

The present invention relates to an LED module used for e.g. an electronic message display on a train and designed to emit white light by mixing lights of different colors from three LED chips. The present invention also relates to an LED dot matrix display utilizing such an LED module.

BACKGROUND ART

FIG. 16 illustrates an example of conventional LED module (see Patent Document 1, for example). The LED module X illustrated in the figure includes a rectangular module substrate 91, on which three LED chips 94R, 94G, 94B are mounted. The module substrate 91 is formed with a plurality of electrodes 92R, 92G, 92B, 93R, 93G, 93B. The LED chips 94R, 94G and 94B are bonded to the electrodes 92R, 92G and 92B, respectively. The electrodes 93R, 93G and 93B are electrically connected to the LED chips 94R, 94G and 94B via wires 95R, 95G and 95B, respectively. The three LED chips 94R, 94G, 94B are covered by a light-transmitting sealing resin 96. The electrodes 92R, 92G, 92B, 93R, 93G, 93B include portions covering the side surfaces and reverse surface of the module substrate 91. These portions are utilized for mounting of the LED module X. The LED chips 94R, 94G and 94B emit red light, green light and blue light, respectively. By mixing the light from the LED chips 94R, 94G and 94B, the LED module X emits white light. By arranging a plurality of LED modules X in a matrix, an LED dot matrix display for use in an electronic message display is obtained.

There is an increasing demand for size reduction of an LED module X. Further, to properly mix the light of different colors, it is desirable that the LED chips 94R, 94G, 94B are arranged as close to each other as possible. However, the LED module X requires a space for arranging the wires 95R, 95G, 95B and a space for arranging the portions of the electrodes 93R, 93G, 93B to which the wires 95R, 95G, 95B are to be bonded, in addition to a space for arranging the LED chips 94R, 94G, 94B. These parts or portions need to be arranged without mutual contact or short-circuiting. Thus, it is not easy to arrange the LED chips 94R, 94G, 94B close to each other and make the LED module X compact.

Further, in recent years, LED dot matrix displays are required to have high resolution. However, when LED modules X are arranged at a high density, the module substrates 91 occupy a large proportion of the display region of the LED dot matrix display. Generally, the module substrates 91, which are made of glass fiber-reinforced epoxy resin, are milk white. Thus, even when all the LED modules X are in the OFF state, the display region of the dot matrix display appears white, which leads to a poor contrast relative to the ON state.

Patent Document 1: JP-A-2003-17753

DISCLOSURE OF THE INVENTION

Problems to be Solved by the Invention

The present invention has been proposed under the circumstances described above. It is therefore an object of the present invention to provide an LED module and an LED dot matrix display which are capable of enhancing the contrast and achieving the size reduction and proper color mixing.

Means for Solving the Problems

According to a first aspect of the present invention, there is provided an LED module including a first, a second and a third LED chips, and a module substrate on which the first, the second and the third LED chips are mounted. A first wire is connected to the first LED chip, and the second LED chip and the third LED chip are arranged to face each other across the first wire.

Preferably, a second wire and a third wire are connected to the second LED chip and the third LED chip, respectively, and each of the second wire and the third wire extends away from the first wire.

Preferably, the first LED chip is smaller than the second and the third LED chips.

Preferably, the first LED chip emits red light, one of the second and the third LED chips emits blue light, and the other one of the second and the third LED chips emits green light.

Preferably, the module substrate has a pair of sides extending in parallel to each other. The first wire extends perpendicularly to a direction in which the paired sides extend.

Preferably, the LED module further includes a pair of first electrodes each of which includes a portion covering part of a respective one of the paired sides. The first LED chip is bonded to one of the first electrodes, and the first wire is connected to the other one of the first electrodes.

Preferably, the LED module further includes two pairs of second electrodes including portions covering respective two ends of each of the paired sides. The second LED chip is electrically connected to one of the two pairs of the second electrodes, whereas the third LED chip is electrically connected to the other one of the two pairs of the second electrodes.

According to a second aspect of the present invention, there is provided an LED module including: a first, a second and a third LED chips; a module substrate on which the first, the second and the third LED chips are mounted; and a common electrode formed on the module substrate and electrically connected to the first, the second and the third LED chips. Part of the common electrode is arranged between the third LED chip and each of the first and the second LED chips.

Preferably, the first, the second and the third LED chips are respectively arranged at locations corresponding to vertices of a triangle.

Preferably, the first LED chip emits red light, the second LED chip emits blue light and the third LED chip emits green light.

Preferably, the module substrate has a substantially rectangular shape having a first, a second, a third and a fourth corners. The module substrate is formed with a first, a second and a third individual electrodes electrically connected to the first, the second and the third LED chips, respectively. The first, the second and the third individual electrodes include portions covering the first, the second and the third corners, respectively, whereas the common electrode includes a portion covering the fourth corner.

Preferably, the module substrate has a dark color at least at a portion of a surface on which the LED chips are mounted.

Preferably, the module substrate contains a pigment or dye of a dark color.

Preferably, the module substrate is formed with a wiring pattern at least on the surface on which the LED chips are mounted, and the surface has a dark color at a portion that is not covered with the wiring pattern.

Preferably, the surface of the module substrate entirely has a dark color.

Preferably, the dark color is black.

Preferably, the LED module further includes a sealing resin member covering the LED chips and made of a resin of a dark color that transmits light from the LED chips.

According to a third aspect of the present invention, there is provided LED dot matrix display including a plurality of LED modules provided according to the first aspect of the present invention, and a main board on which the LED modules are mounted in a matrix. At least part of the surface of the main board, on which the LED modules are mounted, has a dark color.

Other features and advantages of the present invention will become more apparent from the detailed description given below with reference to the accompanying drawings.

BEST MODE FOR CARRYING OUT THE INVENTION

Preferred embodiments of the present invention are described below with reference to the accompanying drawings.

Figure 1:
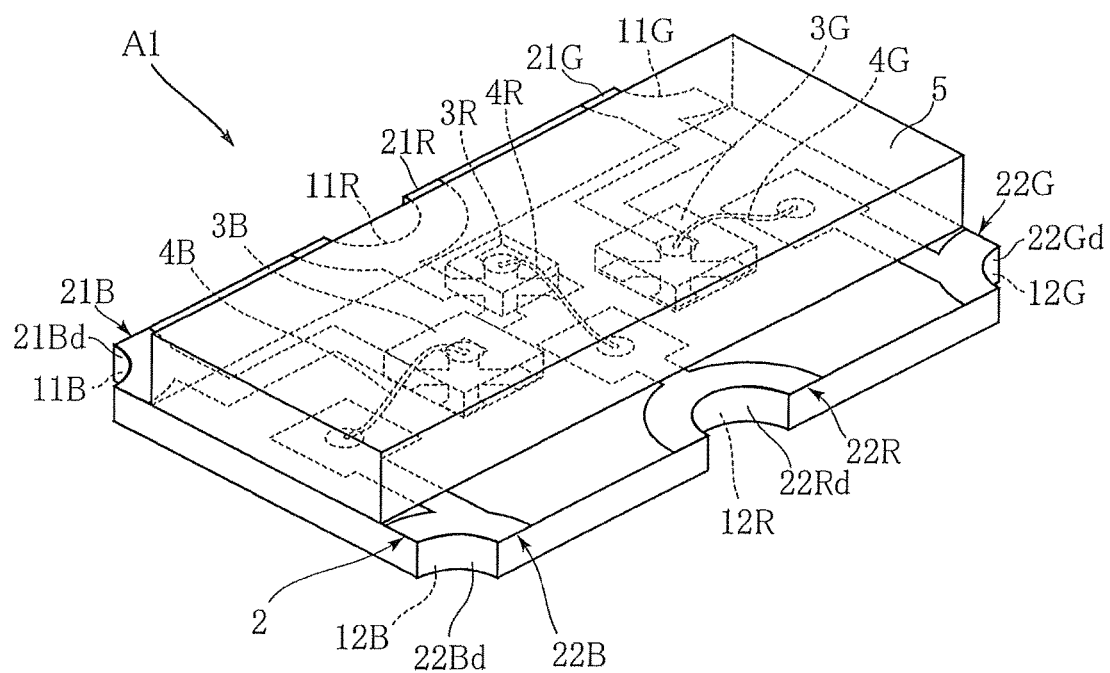
FIG. 1 is a perspective view illustrating an LED module according to a first embodiment of the present invention.
Figure 2:
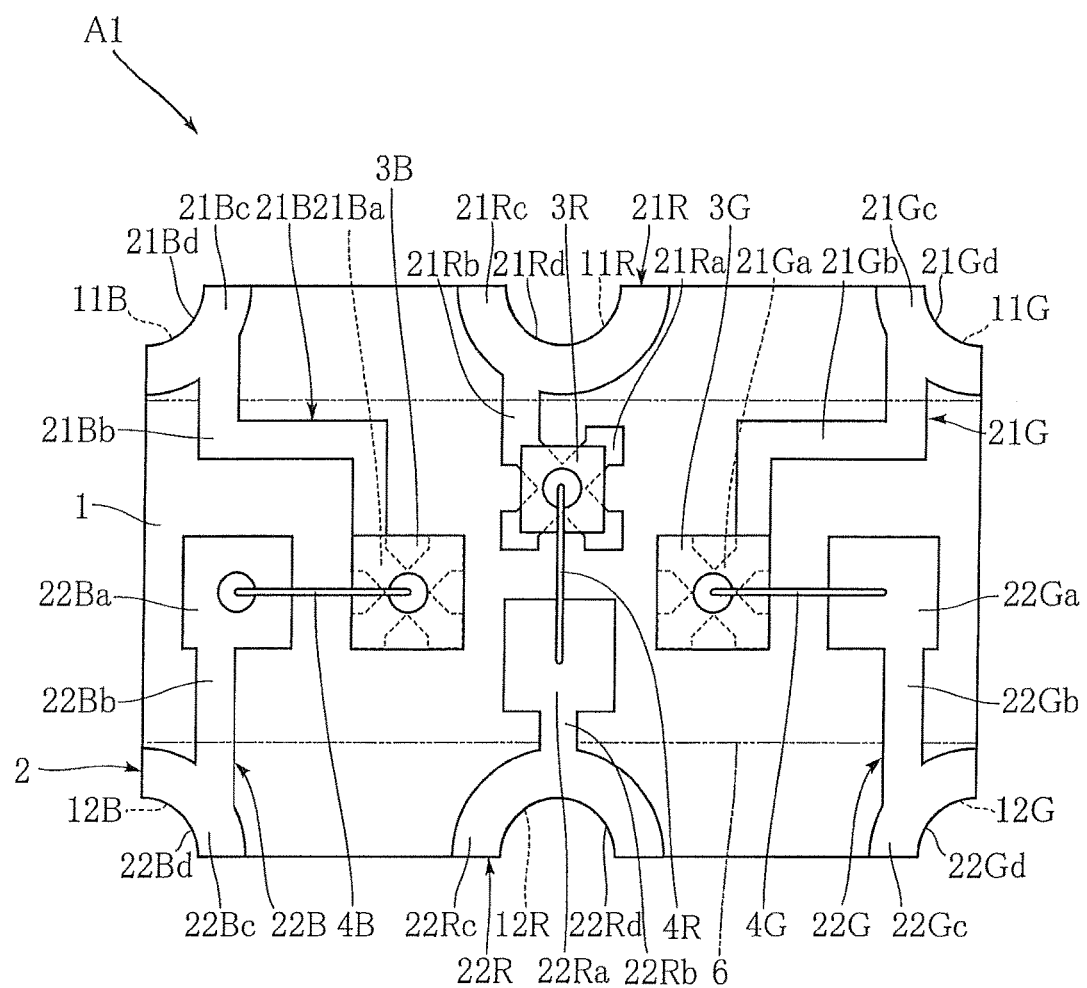
FIG. 2 is a plan view illustrating the LED module according to the first embodiment of the present invention.
Figure 3:
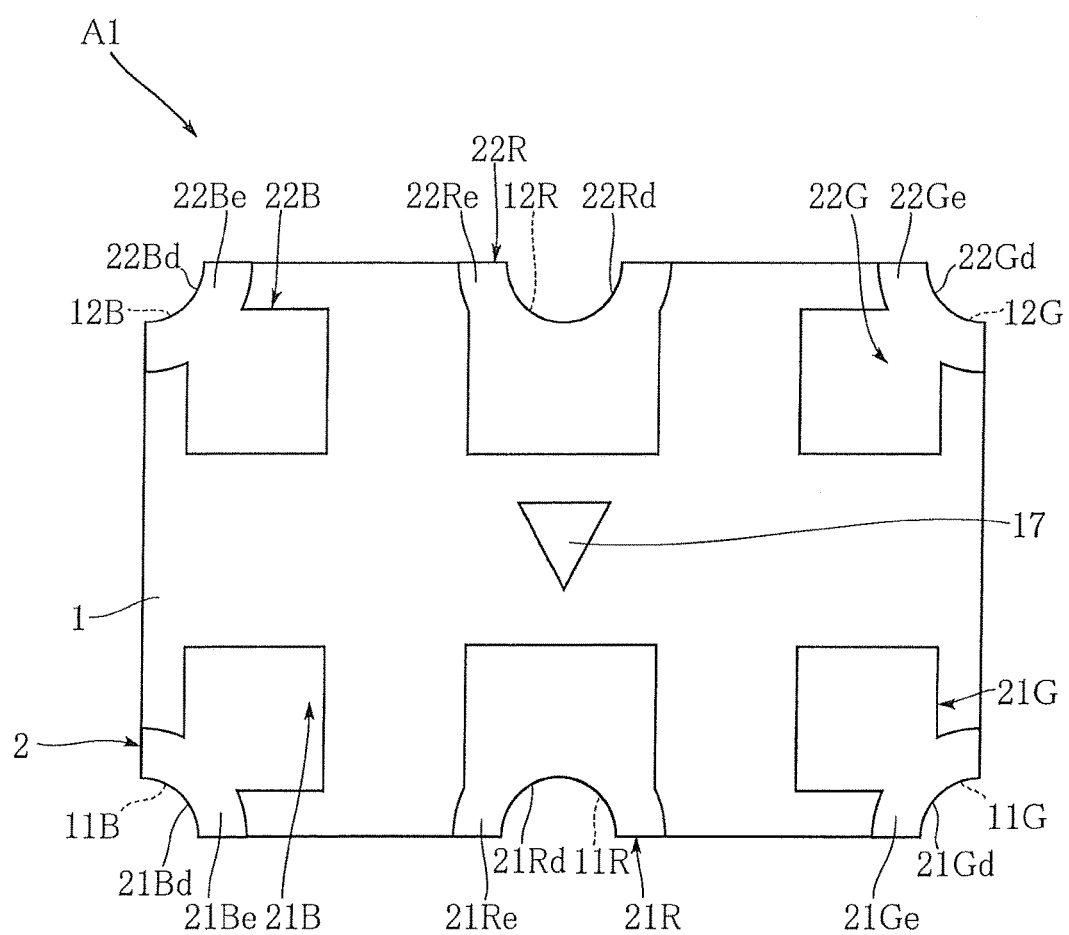
FIG. 3 is a bottom view illustrating the LED module according to the first embodiment of the present invention.

FIGS. 1-3 illustrate an LED module according to a first embodiment of the present invention. The LED module A1 of this embodiment includes a module substrate 1, a wiring pattern 2, LED chips 3R, 3G, 3B, wires 4R, 4G, 4B and a sealing resin 5. The LED module A1 is designed to emit white light by mixing red light, blue light and green light. The LED module A1 of this embodiment has a very small size of about 1.0 mm×1.5 mm in plan view and about 0.2 mm in height. For easier understanding, the sealing resin 5 is illustrated by imaginary lines in FIG. 2.

The module substrate 1 is an insulating substrate made of e.g. glass fiber-reinforced epoxy resin and has a substantially rectangular shape. The module substrate 1 has an obverse surface on which the LED chips 3R, 3G, 3B are mounted, and a reverse surface which is opposite to the obverse surface in the thickness direction. The reverse surface of the module substrate 1 is utilized as a mount surface for mounting the LED module A1. The module substrate 1 is formed with a plurality of grooves 11R, 11G, 11B, 12R, 12G, 12B extending in the thickness direction of the module substrate 1. The grooves 11G, 11B, 12G, 12B are provided at the four corners of the module substrate 1. Each of the grooves 11R and 12R is provided at or near the center of a respective one of the long sides of the module substrate 1. The size of the module substrate 1 may be about 1.0 mm×1.5 mm in plan view and about 0.05 mm in thickness.

The wiring pattern 2 is made of a plating layer of Cu, Ni or Au, for example, and includes electrodes 21R, 21G, 21B, 22R, 22G, 22B. The electrodes 21R, 21G, 21B serve to supply power to the LED chips 3R, 3G, 3B. The electrode 21R includes a pad 21Ra, a strip portion 21Rb, a semi-annular portion 21Rc, a semi-cylindrical portion 21Rd and a mount portion 21Re. The electrodes 21G and 21B include pads 21Ga, 21Ba, strip portions 21Gb, 21Bb, quarter-annular portions 21Gc, 21Bc, quarter-cylindrical portions 21Gd, 21Bd and mount portions 21Ge, 21Be. The electrode 21R corresponds to a first electrode of the present invention, whereas the electrodes 21G and 21B correspond to a second electrode of the present invention.

As illustrated in FIG. 2, the pads 21Ra, 21Ga and 21Ba are provided on the obverse surface of the module substrate 1 for bonding the LED chips 3R, 3G and 3B, respectively. In this embodiment, the pads 21Ra, 21Ga, 21Ba are substantially X-shaped. The pads 21Ga and 21Ba are aligned in parallel to one of long sides of the module substrate 1 which extend in the lateral direction. The pad 21Ra is arranged at a position deviated from the pads 21Ga and 21Ba toward the other long side of the module substrate 1. In this embodiment, the pads 21Ra, 21Ga, 21Ba are arranged to form an isosceles triangle, with the pad 21Ra positioned at the vertex.

The strip portions 21Rb, 21Gb, 21Bb extend from the pads 21Ra, 21Ga, 21Ba toward a long side of the module substrate 1. Specifically, the strip portion 21Rb extends toward the center of the long side. The strip portions 21Gb and 21Bb extend in the form of a crank toward the two ends of the long side. The semi-annular portion 21Rc surrounds the opening of the groove 11R in the obverse surface side of the module substrate 1. The quarter-annular portions 21Gc and 21Bc surround the openings of the grooves 11G and 11B in the obverse surface side of the module substrate 1. The semi-cylindrical portion 21Rd is formed to cover the groove 11R. The quarter-cylindrical portions 21Gd and 21Bd are formed to cover the grooves 11G and 11B. As illustrated in FIG. 3, the mount portions 21Re, 21Ge, 21Be are formed to surround the openings of the grooves 11R, 11G, 11B in the reverse surface side of the module substrate 1 and have a shape obtained by combining a semi-annular or quarter-annular portion and a rectangular portion. The mount portions 21Re, 21Ge, 21Be are utilized for surface-mounting of the LED module A1 on e.g. a circuit board. The semi-cylindrical portion 21Rd, the quarter-cylindrical portions 21Gd, 21Bd, the semi-annular portion 21Rc and the quarter-annular portions 21Gc, 21Bc are utilized for promoting formation of a solder fillet in surface-mounting the LED module A1.

The electrodes 22R, 22G, 22B serve to supply power to the LED chips 3R, 3G, 3B. The electrode 22R includes a pad 22Ra, a strip portion 22RB, a semi-annular portion 22Rc, a semi-cylindrical portion 22Rd and a mount portion 22Re. The electrodes 22G and 22B include pads 22Ga, 22Ba, strip portions 22GB, 22BB, quarter-annular portions 22Gc, 22Bc, quarter-cylindrical portions 22Gd, 22Rd and mount portions 22Ge, 22Be. The electrode 22R corresponds to a first electrode of the present invention, whereas the electrodes 22G and 22B correspond to a second electrode of the present invention.

As illustrated in FIG. 2, the pads 22Ra, 22Ga and 22Ba are provided on the obverse surface of the module substrate 1 for bonding the wires 4R, 4G and 4B, respectively. In this embodiment, the pads 22Ra, 22Ga, 22Ba are rectangular. The pad 22Ra is spaced from the pad 21Ra in the direction in which the short sides of the module substrate 1 extend. Relative to the pads 21Ga and 21Ba, the pads 22Ga and 22Ba are arranged closer to the two ends of the module substrate 1 in the direction in which the long sides of the module substrate extend.

The strip portions 22RB, 22GB, 22BB extend from the pads 22Ra, 22Ga, 22Ba toward a long side of the module substrate 1. Specifically, the strip portion 22RB extends toward the center of the long side. The strip portions 22GB and 22BB extend toward the two ends of the long side. The semi-annular portion 22Rc surrounds the opening of the groove 12R in the obverse surface side of the module substrate 1. The quarter-annular portions 22Gc and 22Bc surround the openings of the grooves 12G and 12B in the obverse surface side of the module substrate 1. The semi-cylindrical portion 22Rd is formed to cover the groove 12R. The quarter-cylindrical portions 22Gd and 22Bd are formed to cover the grooves 12G and 12B. As illustrated in FIG. 3, the mount portions 22Re, 22Ge, 22Be are formed to surround the openings of the grooves 12R, 12G, 12B in the reverse surface side of the module substrate 1 and have a shape obtained by combining a semi-annular or quarter-annular portion and a rectangular portion. The mount portions 22Re, 22Ge, 22Be are utilized for surface-mounting of the LED module A1 on e.g. a circuit board. The semi-cylindrical portion 22Rd, the quarter-cylindrical portions 22Gd, 22Bd, the semi-annular portion 22Rc and the quarter-annular portions 22Gc, 22Bc are utilized for promoting formation of a solder fillet in surface-mounting the LED module A1.

Each of the LED chips 3R, 3G, 3B has e.g. a laminated structure made up of a p-type semiconductor layer, an n-type semiconductor layer and an active layer sandwiched between the p-type semiconductor layer and the n-type semiconductor layer. The LED chip 3R emits red light, the LED chip 3G emits green light and the LED chip 3B emits blue light. The LED chips 3R, 3G and 3B are bonded to the pads 21Ra, 21Ga and 21Ba, respectively, via e.g. conductive paste. Thus, in this embodiment, the LED chips 3R, 3G, 3B are arranged to form an isosceles triangle, with the LED chip 3R for emitting red light positioned at the vertex facing the base of the triangle. The LED chip 3R has a size of about 0.15×0.15 mm in plan view, whereas the LED chips 3G and 3B have a size of about 0.2×0.2 mm to 0.3×0.3 mm in plan view. Thus, the LED chip 3R for emitting red light is relatively small.

The wires 4R, 4G and 4B are made of e.g. Au and electrically connect the anode electrodes (not shown) of the LED chips 3R, 3G and 3B to the electrodes 22R, 22G and 22B, respectively. The wire 4R connects the LED chip 3R and the pad 22Ra to each other and extends in the short-side direction of the module substrate 1. The wires 4G, 4B connect the LED chips 3G, 3B and the pads 22Ga, 22Ra to each other. In this embodiment, the wires 4G, 4B extend from the LED chips 3G, 3B toward the two ends of the module substrate 1 in the long-side direction of the module substrate 1.

The sealing resin 5 is made of e.g. a transparent resin which transmits light from the LED chips 3R, 3G, 3B and covers the LED chips 3R, 3G, 3B and wires 4R, 4G, 4B. The reverse surface of the module substrate 1 is formed with a resist film 17. The resist film 17 serves to prevent mounting of the LED module A1 with wrong polarity.

The advantages of the LED module A1 are described below.

In this embodiment, the LED chips 3G and 3B are arranged to face each other across the wire 4R so that the LED chips 3R, 3G, 3B form a triangle. No other elements are arranged between the wire 4R and the LED chip 3G or 3B. Thus, it is possible to arrange the LED chips 3G and 3B close to each other and hence arrange the LED chips 3G, 3B and the LED chip 3R close to each other. Thus, the arrangement of this embodiment ensures the size reduction of the LED module A1 while achieving proper mixing of light from the LED chips 3R, 3G, 3B.

Since the LED chip 3R is smaller than the LED chips 3G and 3B, the LED chips 3G and 3B can be arranged close to each other. Moreover, the arrangement of the LED chip 3R, which emits red light, at the vertex of the isosceles triangle formed by the LED chips 3R, 3G, 3B is suitable for balanced mixing of light from the LED chips 3R, 3G, 3B.

The wires 4G and 4B are arranged to extend perpendicularly to the wire 4R. With this arrangement, the pads 22Ga, 22Ba, to which the wires 4G, 4B are connected, can be arranged compactly in the short-side direction of the module substrate 1.

The electrodes 21R, 21G, 21B, 22R, 22G, 22B include mount portions 21Re, 21Ge, 21Be, 22Re, 22Ge, 22Be positioned at the four corners or the center of a long side of the module substrate 1. The strip portions 21Rb, 21Gb, 21Bb, 22RB, 22GB, 22BB extend from the pads 21Ra, 21Ga, 21Ba, 22Ra, 22Ga, 22Ba to the mount portions 21Re, 21Ge, 21Be, 22Re, 22Ge, 22Be through relatively short routes. Thus, an unnecessary space is not created in the surface of the module substrate 1, which is suitable for the size reduction of the LED module A1.

FIGS. 4-15 illustrate other embodiments of the LED module according to the present invention and an LED dot matrix display according to the present invention. In these figures, the elements which are identical or similar to those of the foregoing embodiment are designated by the same reference signs as those used for the foregoing embodiment.

Figure 4:
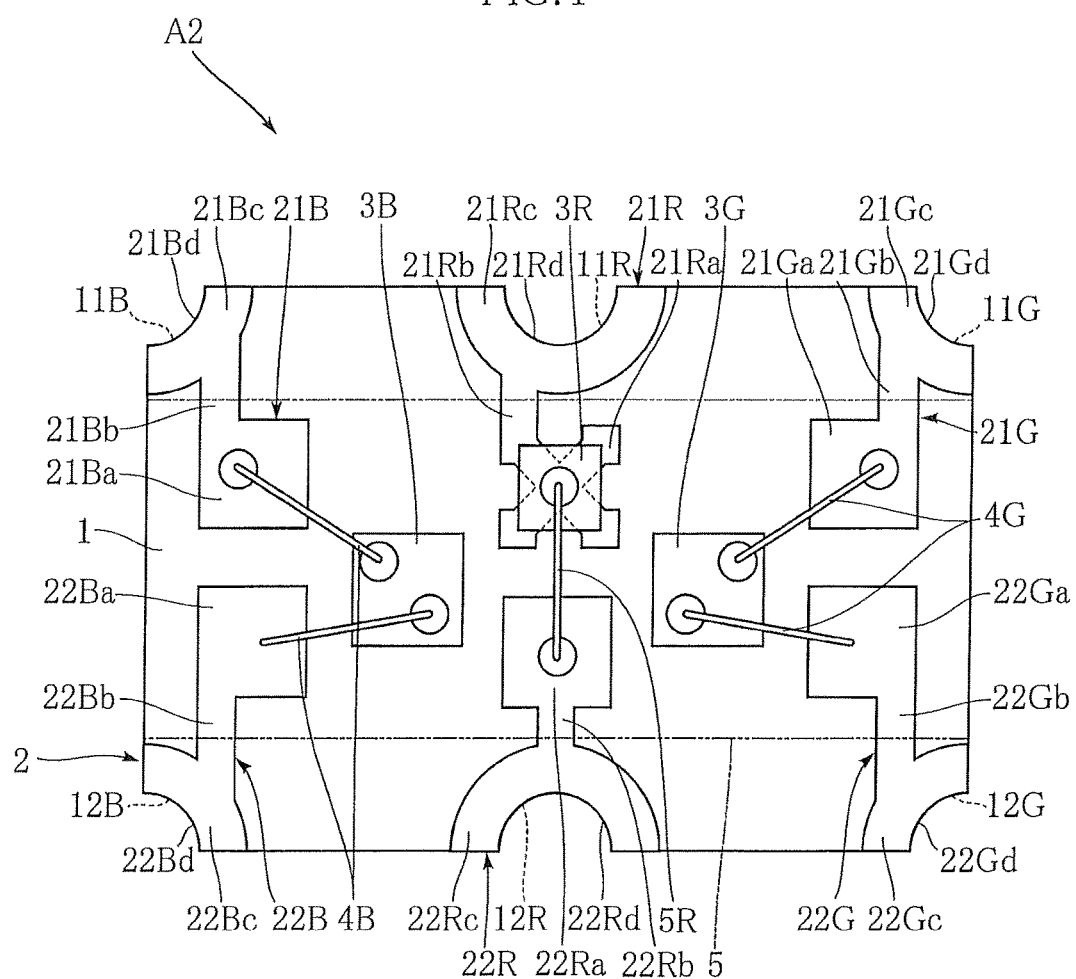
FIG. 4 is a plan view illustrating an LED module according to a second embodiment of the present invention.

FIG. 4 illustrates an LED module according to a second embodiment of the present invention. The LED module A2 of this embodiment differs from that of the foregoing embodiment in structure of the LED chips 3G and 3B. Specifically, each of the LED chips 3G and 3B includes two electrodes on the upper surface. Thus, two wires 4G and two wires 4B are bonded to the LED chips 3G and 3B, respectively. One of the wires 4G and one of the wires 4B are bonded to the pads 21Ga and 21Ba, respectively. The pads 21Ga, 21Ba of the electrodes 21G, 21B are aligned with the pads 22Ga, 22Ba of the electrodes 22G, 22B in the short-side direction of the module substrate 1, respectively.

According to this embodiment again, mixing of light from the LED chips 3R, 3G, 3B is promoted, and the size reduction of the LED module A1 is achieved. As will be understood from this embodiment, the present invention is also applicable to an LED module including two-wire type LED chips.

Figure 5:
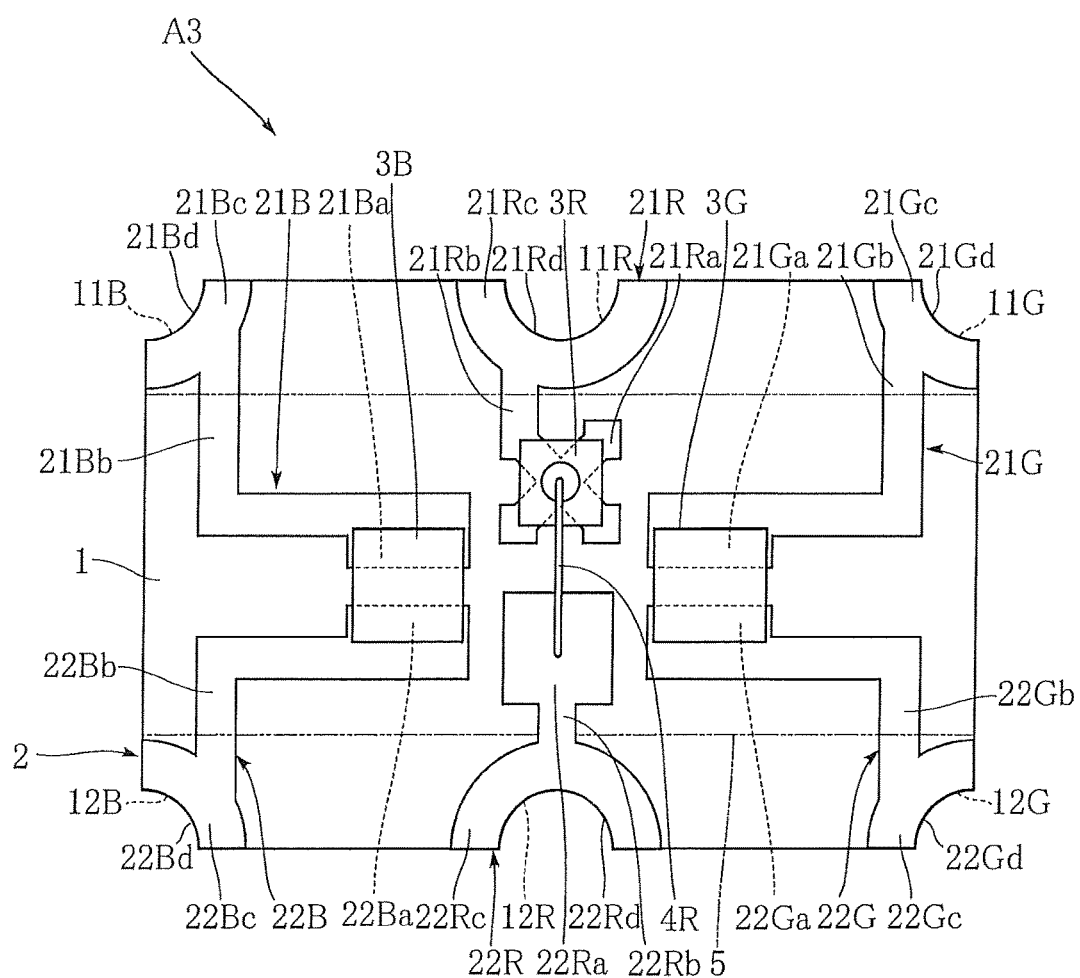
FIG. 5 is a plan view illustrating an LED module according to a third embodiment of the present invention.

FIG. 5 illustrates an LED module according to a third embodiment of the present invention. The LED module A3 of this embodiment differs from the foregoing embodiments in structure of the LED chips 3G and 3B. Specifically, each of the LED chips 3B and 3G of this embodiment have a flip-chip structure including two electrodes on the lower surface. To correspond to this structure, the pads 21Ga and 21Ba have a horizontally elongated shape to overlap the LED chips 3G and 3B, respectively. The pads 22Ga and 22Ba are arranged next to the pads 21Ga and 21Ba, respectively, in the short-side direction of the module substrate 1. The two electrodes of the LED chip 3G are bonded to the pads 21Ga and 22Ga, whereas the two electrodes of the LED chip 3B are bonded to the pads 21Ba and 22Ba.

According to this embodiment again, the size reduction of the LED module A1 and mixing of light of different colors are promoted. As will be understood from this embodiment, the present invention is also applicable to an LED module including flip-chip type LED chips.

Figure 6:
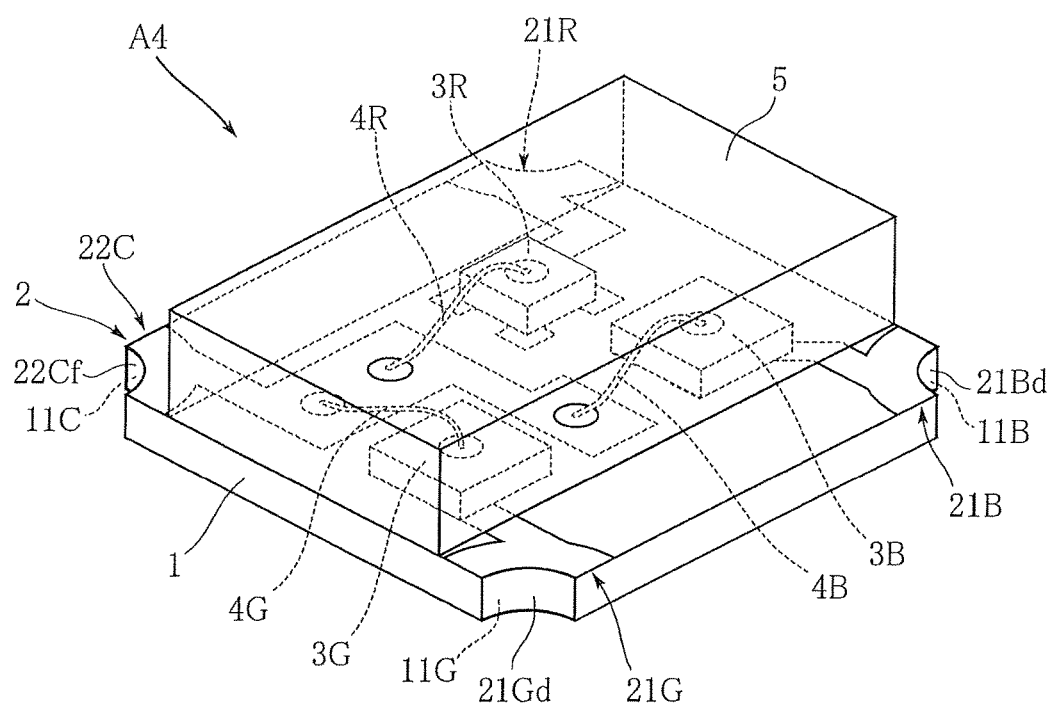
FIG. 6 is a perspective view illustrating an LED module according to a fourth embodiment of the present invention.
Figure 7:
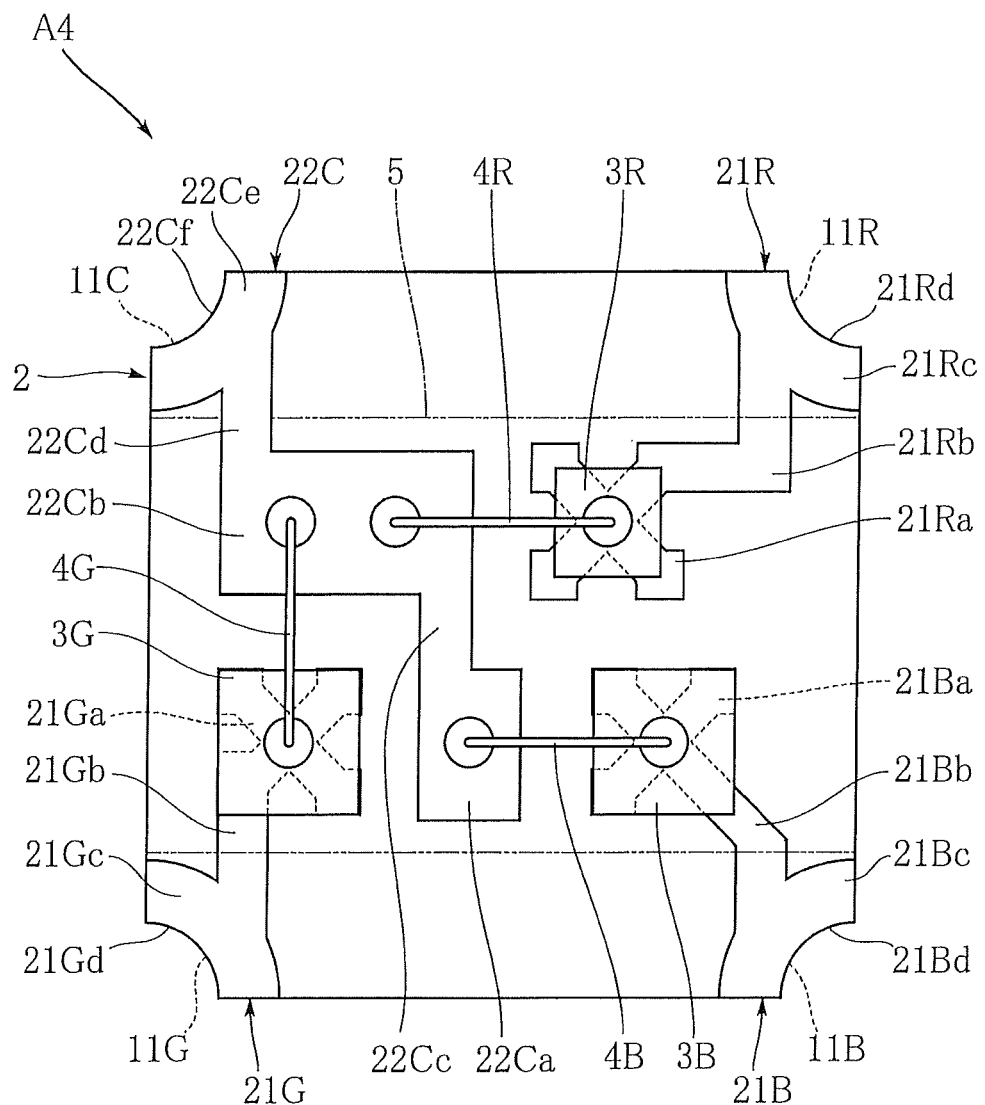
FIG. 7 is a plan view illustrating the LED module according to the fourth embodiment of the present invention.
Figure 8:
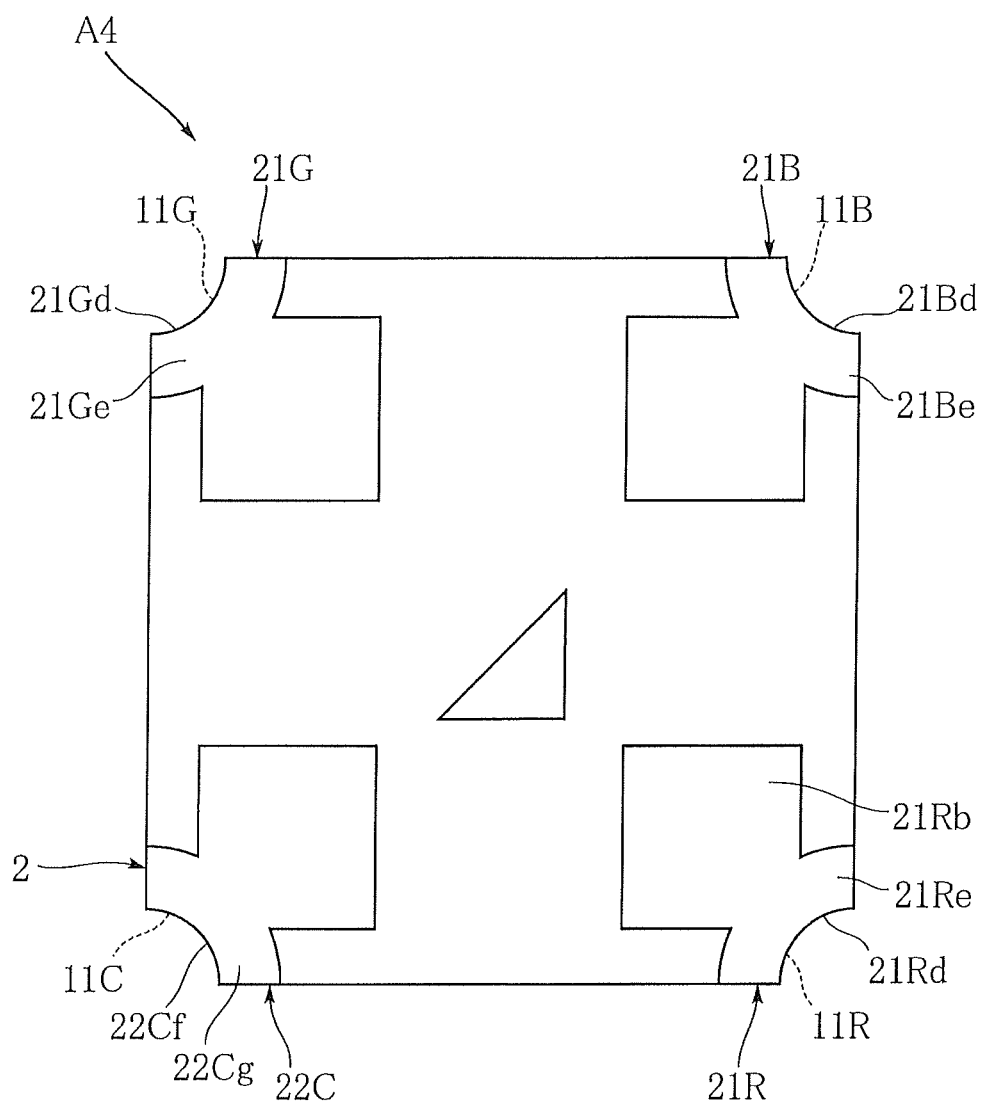
FIG. 8 is a bottom view illustrating the LED module according to the fourth embodiment of the present invention.

FIGS. 6-8 illustrate an LED module according to a fourth embodiment of the present invention. The LED module A4 of this embodiment includes a module substrate 1, a wiring pattern 2, LED chips 3R, 3G, 3B, wires 4R, 4G, 4B and a sealing resin 5. The LED module A4 is designed to emit white light by mixing red light, blue light and green light. The LED module A4 of this embodiment has a very small size of about 1.0 mm×1.0 mm in plan view and about 0.2 mm in height. For easier understanding, the sealing resin 5 is illustrated by imaginary lines in FIG. 7.

The module substrate 1 is an insulating substrate made of e.g. glass fiber-reinforced epoxy resin and has a substantially rectangular shape. The module substrate 1 has an obverse surface on which the LED chips 3R, 3G, 3B are mounted, and a reverse surface which is opposite to the obverse surface in the thickness direction. The reverse surface of the module substrate 1 is utilized as a mount surface for mounting the LED module A4. The module substrate 1 is formed with a plurality of grooves 11R, 11G, 11B, 11C. The grooves 11R, 11G, 11B, 11C extend in the thickness direction of the module substrate 1 at the four corners of the module substrate 1. The module substrate 1 may be about 1.0 mm×1.0 mm in plan view and about 0.05 mm in thickness.

The wiring pattern 2 includes electrodes 21R, 21G, 21B and a common electrode 22C and is made of a plating layer of Cu, Ni or Au, for example. The electrodes 21R, 21G, 21B serve to supply power to the LED chips 3R, 3G, 3B. The electrodes 21R, 21G, 21B include pads 21Ra, 21Ga, 21Ba, strip portions 21Rb, 21Gb, 21Bb, quarter-annular portions 21Rc, 21Gc, 21Bc, quarter-cylindrical portions 21Rd, 21Gd, 21Bd and mount portions 21Re, 21Ge, 21Be.

As illustrated in FIG. 7, the pads 21Ra, 21Ga and 21Ba are provided on the obverse surface of the module substrate 1 for bonding the LED chips 3R, 3G and 3B, respectively. In this embodiment, the pads 21Ra, 21Ga, 21Ba are substantially X-shaped. The pads 21Ga and 21Ba are aligned in parallel to one of horizontally-extending sides of the module substrate 1. The pad 21Ra is arranged at a position deviated from the pads 21Ga and 21Ba toward the other horizontally-extending side of the module substrate 1. The distance from the pad 21Ra to the pad 21Ba is set shorter than the distance from the pad 21Ra to the pad 21Ga.

The strip portions 21Rb, 21Gb, 21Bb extend from the pads 21Ra, 21Ga, 21Ba toward three corners of the module substrate 1. The quarter-annular portions 21Rc, 21Gc, 21Bc surround the openings of the grooves 11R, 11G, 11B in the obverse surface side of the module substrate 1. The quarter-cylindrical portions 21Rd, 21Gd, 21Bd are formed to cover the grooves 11R, 11G, 11B. As illustrated in FIG. 8, the mount portions 21Re, 21Ge, 21Be are formed to surround the openings of the grooves 11R, 11G, 11B in the reverse surface side of the module substrate 1. The mount portions 21Re, 21Ge, 21Be are utilized for surface-mounting of the LED module A4 on e.g. a circuit board. The quarter-cylindrical portions 21Rd, 21Gd, 21Bd and the quarter-annular portions 21Rc, 21Gc, 21Bc are utilized for promoting formation of a solder fillet in surface-mounting the LED module A4.

The common electrode 22C is electrically connected to all the LED modules 3R, 3G, 3B. The common electrode 22C includes pads 22Ca, 22Cb, strip portions 22Cc, 22Cd, a quarter-annular portion 22Ce, a quarter-cylindrical portion 22Cf and a mount portion 22Cg. The pads 22Ca and 22Cb are provided on the obverse surface of the module substrate 1 for bonding the wires 4R, 4G, 4B. The pad 22Ca is in the form of a vertically elongated rectangle and arranged between the pads 21Ga and 21Ba. The pad 22Cb is in the form of a horizontally elongated rectangle and arranged on the left side of the pad 21Ra and on the upper side of the pad 21Ga in FIG. 7. The strip portion 22Cc connects the pads 22Ca and 22Cb to each other. The strip portion 22Cd extends from the pad 22Cb toward the groove 11C of the module substrate 1. The quarter-annular portion 22Ce surrounds the opening of the groove 11C in the obverse surface side of the module substrate 1. The quarter-cylindrical portion 22Cf is formed to cover the groove 11C. As illustrated in FIG. 8, the mount portion 22Cg surrounds the opening of the groove 11C in the reverse surface side of the module substrate 1 and is utilized for surface-mounting of the LED module A4 on e.g. a circuit board. The quarter-cylindrical portion 22Cf and the quarter-annular portion 22Ce are utilized for promoting formation of a solder fillet in surface-mounting the LED module A4.

Each of the LED chips 3R, 3G, 3B has e.g. a laminated structure made up of a p-type semiconductor layer, an n-type semiconductor layer and an active layer sandwiched between the p-type semiconductor layer and the n-type semiconductor layer. The LED chip 3R emits red light, the LED chip 3G emits green light and the LED chip 3B emits blue light. The LED chips 3R, 3G and 3B are bonded to the bonding pads 21Ra, 21Ga and 21Ba, respectively, via e.g. conductive paste. In this embodiment, the LED chips 3R, 3G, 3B are arranged to form vertices of a triangle. The LED chip 3R has a size of about 0.15×0.15 mm in plan view, whereas the LED chips 3G and 3B have a size of about 0.2×0.2 mm to 0.3×0.3 mm in plan view. Thus, the LED chip 3R for emitting red light is relatively small.

The wires 4R, 4G, 4B are made of e.g. Au and electrically connect the anode electrodes (not shown) of the LED chips 3R, 3G, 3B to the electrode 22C. In this embodiment, the wire 4B is connected to the LED chip 3B and the pad 22Ca. The wires 4R and 4G are connected to the LED chip 3R or 3G and the pad 22Cb.

The sealing resin 5 is made of e.g. a transparent resin which transmits light from the LED chips 3R, 3G, 3B and covers the LED chips 3R, 3G, 3B and wires 4R, 4G, 4B. The reverse surface of the module substrate 1 is formed with e.g. a resist film for preventing the LED module A4 from being mounted with wrong polarity.

The advantages of the LED module A4 are described below.

In this embodiment, all the wires 4R, 4G, 4B are bonded to the common electrode 22C. Since the wire 4B is bonded to the pad 22Ca arranged between the LED chips 3G and 3B, the wire 4B does not need to be long, and further, the bonding portions of the wires 4R, 4G, 4B are prevented from being positioned too close to each other. Further, the portions for bonding the wires 4R, 4G, 4B do not project largely in the plan-view direction relative to the LED chips 3R, 3G, 3B. Thus, the LED chips 3R, 3G, 3B can be arranged close to each other, which leads to the size reduction of the LED module A4.

By arranging the LED chips 3R, 3G, 3B close to each other to form a triangle, red light, green light and blue light from the LED chips 3R, 3G, 3B are properly mixed. The LED chip 3G, which emits green light, is separated from the LED chips 3R and 3B by the common electrode 22C, and the distance between the LED chip 3G and the LED chips 3R, 3B is relatively long. However, the visual sensitivity of human eyes to green light is relatively high. Thus, the balanced mixing of red light, green light and blue light from the LED chips 3R, 3G, 3B is achieved.

The electrodes 21R, 21G, 21B and the common electrode 22C are configured and arranged to extend dispersedly toward the four corners of the module substrate 1. With this arrangement, none of the electrodes 21R, 21G, 21B and the common electrode 22C does not need to include an unfavorably long strip portion. Further, an unnecessary space is not created in the surface of the module substrate 1. Thus, the arrangement of this embodiment is suitable for the size reduction of the LED module A4.

Figure 9:
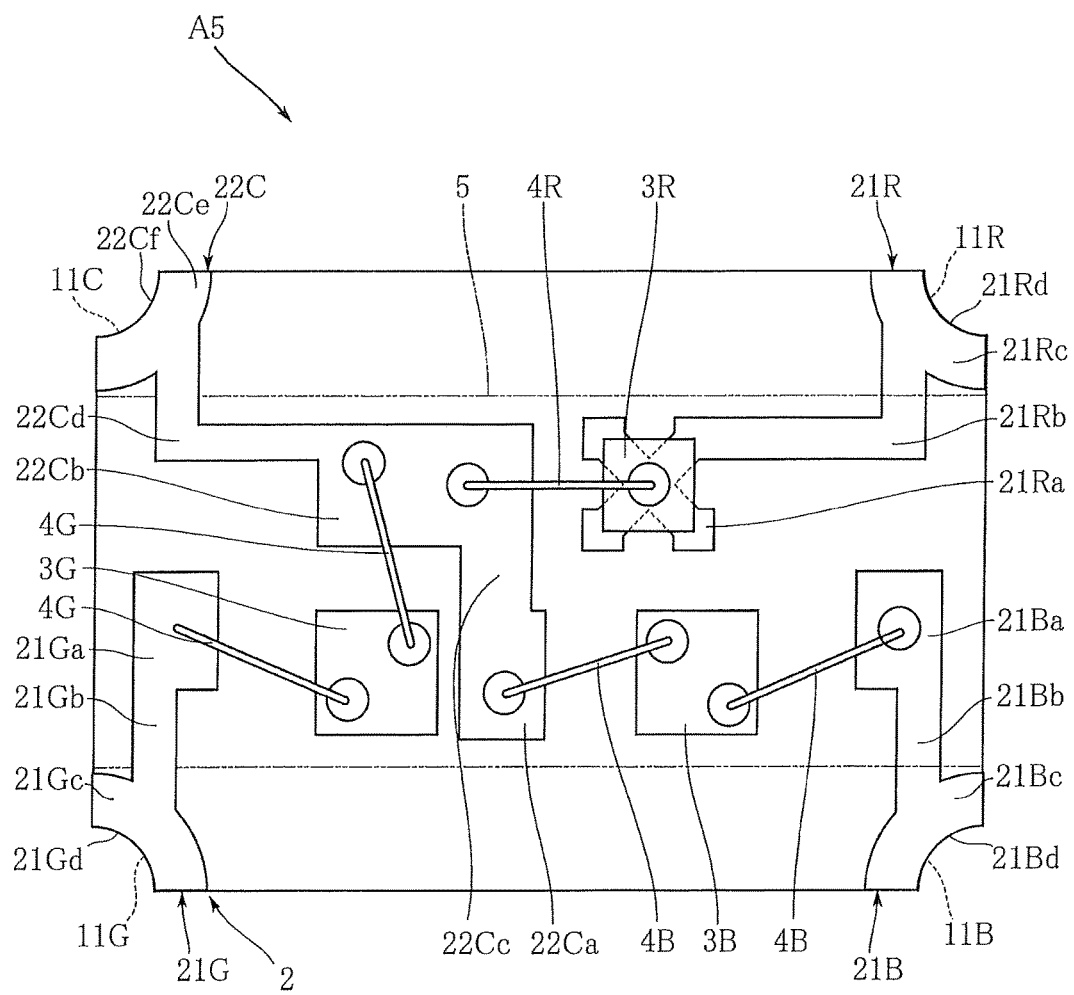
FIG. 9 is a plan view illustrating an LED module according to a fifth embodiment of the present invention.

FIG. 9 illustrates an LED module according to a fifth embodiment of the present invention. The LED module A5 of this embodiment differs from that of the fourth embodiment in structure of the LED chips 3G and 3B. Specifically, each of the LED chips 3G and 3B includes two electrodes on the upper surface. Thus, two wires 4G and two wires 4B are bonded to the LED chips 3G and 3B, respectively. The pad 21Ga and 21Ba of the electrodes 21G and 21B are spaced from the LED chips 3G and 3B in the horizontal direction in FIG. 4. One of the wires 4G and one of the wires 4B are bonded to the pads 21Ga and 21Ba, respectively.

According to this embodiment again, mixing of light from the LED chips 3R, 3G, 3B is promoted. Although the LED module A5 is slightly larger than the LED module A4 of the fourth embodiment because of the difference in arrangement of the pads 21Ga and 21Ba, the LED module A5 is still small for an LED module including two-wire type LED chips 3G, 3B. As will be understood from this embodiment, the present invention is also applicable to an LED module including two-wire type LED chips.

Figure 10:
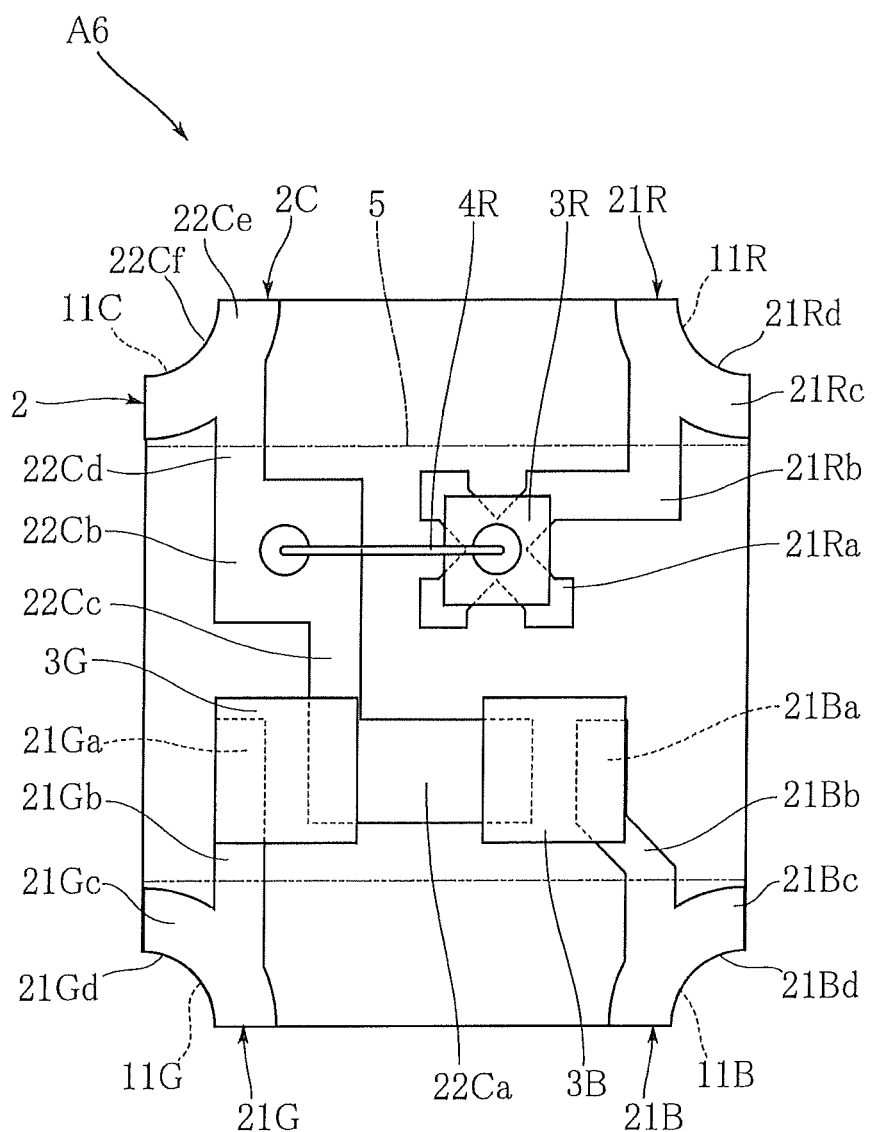
FIG. 10 is a plan view illustrating an LED module according to a sixth embodiment of the present invention.

FIG. 10 illustrates an LED module according to a sixth embodiment of the present invention. The LED module A6 of this embodiment differs from those of the fourth and fifth embodiments in structure of the LED chips 3G and 3B. Specifically, the LED chips 3B and 3G of this embodiment have a flip-chip structure including two electrodes on the lower surface. To correspond to this structure, the pad 22Ca has a horizontally elongated shape to overlap the LED chips 3G and 3B. The pads 21Ga and 21Ba are arranged adjacent to the pads 22 Ca. The two electrodes of the LED chip 3G are bonded to the pads 22Ca and 21Ga, whereas the two electrodes of the LED chip 3B are bonded to the pads 22Ca and 21Ba.

According to this embodiment again, the size reduction of the LED module A6 and mixing of light of different colors are promoted. As will be understood from this embodiment, the present invention is also applicable to an LED module including flip-chip type LED chips.

Figure 11:
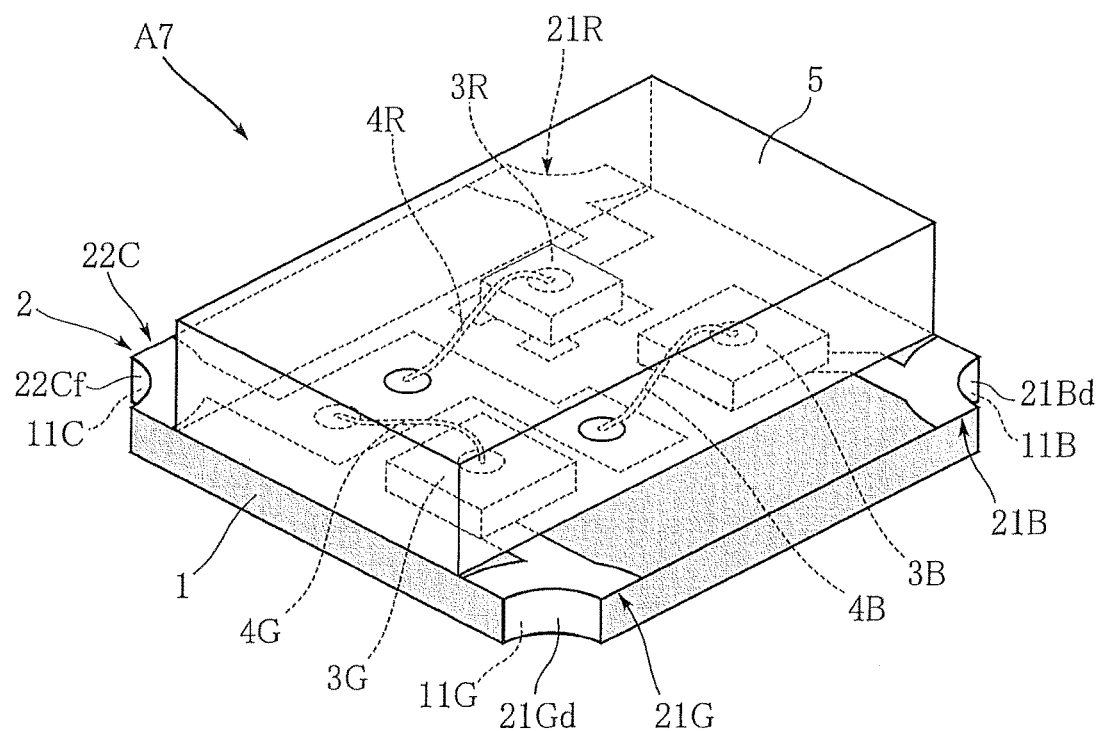
FIG. 11 is a perspective view illustrating an LED module according to a seventh embodiment of the present invention.

FIG. 11 illustrates an LED module according to a seventh embodiment of the present invention. The LED module A7 of this embodiment has the same structure as that of the LED module A4 of the fourth embodiment except for the structure of the module substrate 1.

The module substrate 1 of this embodiment is an insulating substrate which is made of e.g. glass fiber-reinforced epoxy resin containing e.g. a black pigment and hence entirely dark in color. The module substrate 1 is substantially square. In the module substrate 1, the pigment is contained to such a degree that the entirety of the module substrate 1 be black. However, unlike this embodiment, the module substrate 1 may have a dark color other than black, such as dark gray. To prepare the module substrate 1 having a dark color, a dye may be mixed in a glass fiber-reinforced epoxy resin or a coating of a dark color may be applied to the surface of a glass fiber-reinforced epoxy resin. It is only necessary that, of the module substrate 1, at least part of the surface on which the LED chips 3R, 3G, 3B are mounted has a dark color.

Figure 12:
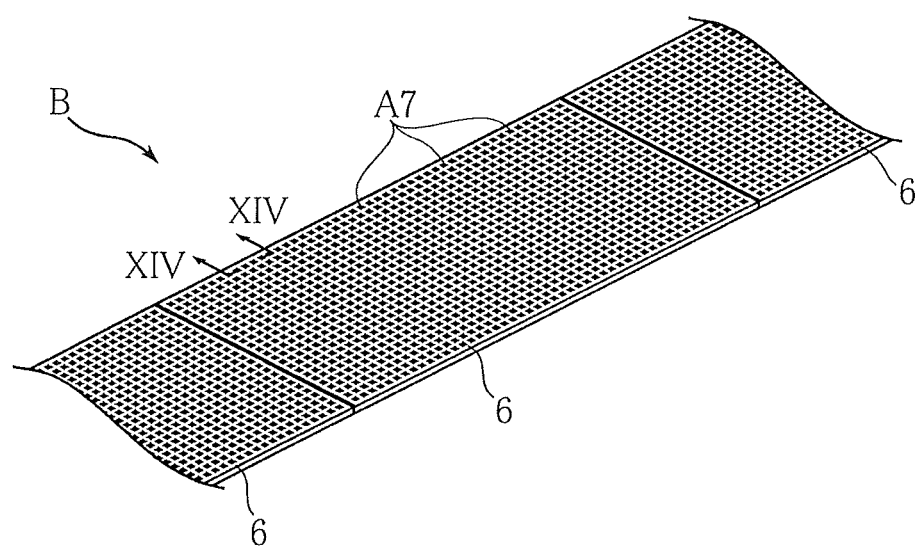
FIG. 12 is a perspective view illustrating a principal portion of an example of LED dot matrix display utilizing the LED module illustrated in FIG. 11.
Figure 13:
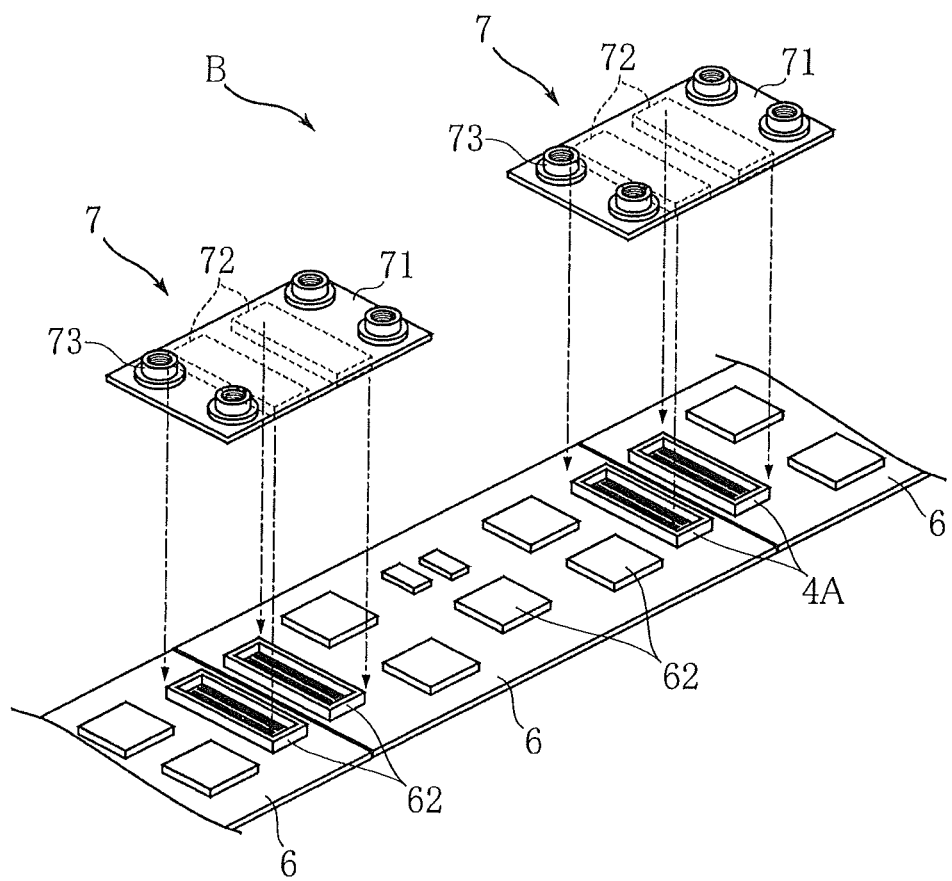
FIG. 13 is a perspective view illustrating a principal portion of the LED dot matrix display utilizing the LED module illustrated in FIG. 11.
Figure 14:
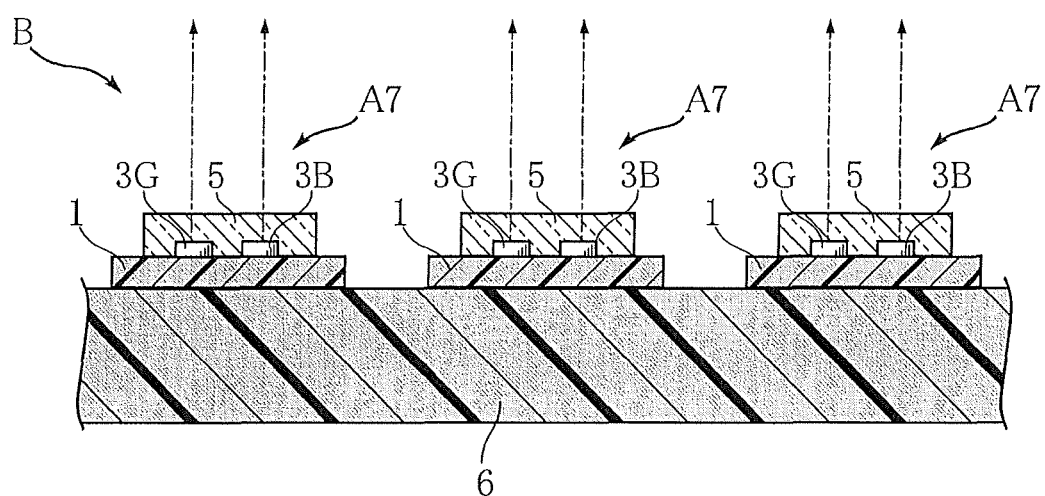
FIG. 14 is a sectional view taken along lines XIV-XIV in FIG. 12.

FIGS. 12-14 illustrate an example of LED dot matrix display which utilizes the LED module A7. The LED dot matrix display B illustrated in these figures includes a plurality of LED modules A7, main boards 6, IC chips 61, connectors 62 and connection modules 7. For easier understanding, the illustration of the wiring pattern 2 is omitted in FIG. 14.

Each of the main boards 6 is in the form of an elongated rectangle and made of e.g. glass fiber-reinforced epoxy resin containing a black pigment. Thus, the main boards 6 are entirely black. However, the color of the main boards 6 is not limited to black, and other dark colors may be employed. Further, it is only necessary that, of the main board 6, at least part of the surface on which the LED modules A7 are mounted has a dark color. The LED modules A7 are mounted on the obverse surface of the main board 6, whereas the IC chips 61 and the connectors 62 are mounted on the reverse surface of the main board 6. The size of the main board 6 is about 36 mm×72 mm, and the LED modules A7 are arranged in a matrix of 24×48 with a pitch of 1.5 mm.

The IC chips 61 drive the LED modules A7 in accordance with inputted display signals. In this embodiment, the IC chips 61 receive display image information as serial signals. The IC chips are small chips having a size of about 5 mm×5 mm in plan view, for example.

The connectors 62 serve to connect a plurality of main boards 6 to each other. The connectors 62 are fitted to the connectors 72 of the connection modules 7, which will be described later.

The plurality of main boards 6 are connected to each other by the connection modules 7. Each of the connection modules 7 includes a connection substrate 71, two connectors 72 and four bosses 73. The connection substrate 71 is made of e.g. glass fiber-reinforced epoxy resin and in the form of a rectangle of about 15 mm×38 mm in plan view.

The two connectors 72 are mounted on a surface of the connection substrate 71 which faces the main boards 6. Each of the connectors 72 is connected to a respective one of the connectors 62.

The bosses 73 are made of an alloy of Cu or Fe, for example, and provided at four corners of the connection substrate 71. The bosses 73 are utilized for fixing the main boards 6 to e.g. another structural element of the LED dot matrix display B along with the connection module 7.

The advantages of the LED dot matrix display B will be described below.

According to this embodiment, the main boards 6 and the module substrates 1, which are black, occupy most part of the display region of the LED dot matrix display B. Thus, when all the LED modules A7 are in the OFF state, the display region of the LED dot matrix display B shows a deep black color. Thus, the contrast of the LED dot matrix display B is enhanced. This enhanced contrast is obtained if only the main boards 6 and the modules substrates 1 have a dark color.

To increase the resolution of the LED dot matrix display B, LED modules A7 are mounted at a higher density. Mounting the LED modules at a higher density means that the module substrates 1 occupy a larger proportion of the display region of the LED dot matrix display B. Since the module substrates 1 are black, it is possible to increase the definition of the LED dot matrix display B while achieving an enhanced contrast.

To make the entirety of the module substrate 1 black is suitable for making the display region of the LED dot matrix display B have a deep black color. However, unlike this embodiment, the module substrate 1 may be made of a glass fiber-reinforced epoxy resin to which a coating of dark colors, which include black, is applied. In this case again, the contrast of the LED dot matrix display B is enhanced.

Figure 15:
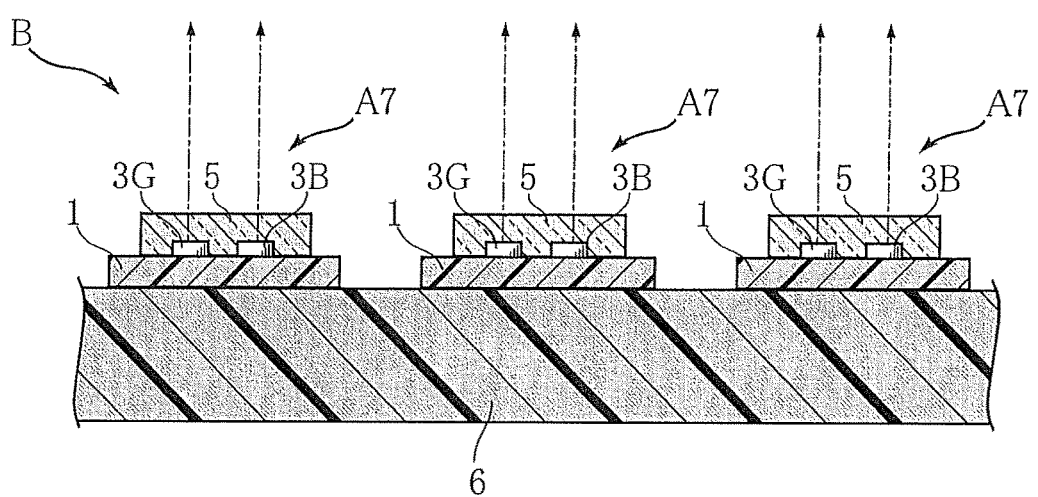
FIG. 15 is a sectional view illustrating a principal portion of an example of dot matrix display utilizing a variation of the LED module illustrated in FIG. 11.
Figure 16:
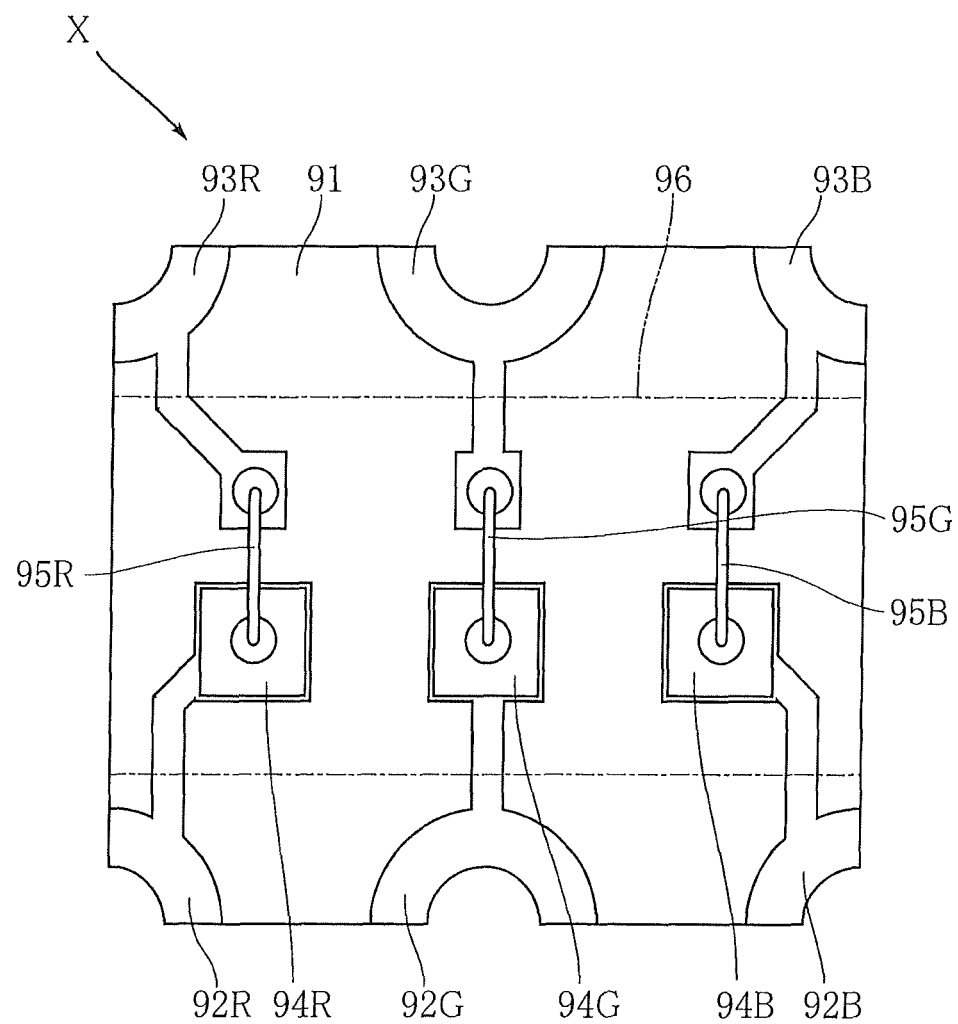
FIG. 16 is a plan view illustrating an example of conventional LED module.

FIG. 15 illustrates an LED dot matrix display B which utilizes a variation of the LED module A7. In the illustrated LED dot matrix display B, a plurality of LED modules A7 are arranged in a matrix. The LED modules A7 differ from the above-described LED modules A7 in material of the sealing resin 5. Specifically, the sealing resin 5 of this variation is made of a light-transmitting resin containing a pigment of a dark black color. When the LED chips 3R, 3G, 3B are in the ON state, the sealing resin 5 transmits the light from the LED chips 3R, 3G, 3B. When the LED chips 3R, 3G, 3B are in the OFF state, the sealing resin shows a substantially black color.

According to this embodiment, when the LED chips 3R, 3G, 3B are in the OFF state, the wiring pattern 6 is prevented from shining due to the reflection of external light. This is suitable for enhancing the contrast of the LED dot matrix display B.

The LED module and LED dot matrix display according to the present invention are not limited to the foregoing embodiments. The specific structure of each part of the LED module and LED dot matrix display of the present invention may be modified in design in many ways.

The invention claimed is:

1. An LED module comprising:
   a first LED chip, a second LED chip and a third LED chip disposed at three vertexes of a triangle, respectively;
   a module substrate including a continuous flat principal surface on which the first LED, the second LED and the third LED are mounted in common;
   a first pad provided on the continuous flat principal surface of the module substrate and directly connected to the first LED chip;
   a second pad provided on the continuous flat principal surface of the module substrate and spaced apart from the first pad in a first direction; and
   a first wire including a first end and a second end, the first end being connected to the first LED chip, the second end being connected to the second pad,
   wherein the second LED chip and the third LED chip are spaced apart from each other in a second direction perpendicular to the first direction with the first wire disposed between the second LED chip and the third LED chip in plan view,
   wherein a distance between the first pad and the second pad is shorter than a spacing distance between the second LED chip and the third LED chip,
   wherein in plan view, at least a part of the first pad, at least a part of the second LED chip and at least a part of the third LED chip overlap with a common straight line parallel to the second direction, and
   wherein the first pad is X-shaped, and in plan view at least a part of the X-shaped first pad protrudes outward from the first LED chip.

2. The LED module according to claim 1, wherein at least a part of the second pad is flanked by the second LED chip and the third LED chip.

3. The LED module according to claim 1, wherein the first LED chip is smaller in size than each of the second LED chip and the third LED chip.

4. The LED module according to claim 1, wherein each of the second LED chip and the third LED chip includes a first surface and the second surface opposite to each other, the first surface being provided with a first electrode and a second electrode.

5. The LED module according to claim 4, wherein the first electrode of the second LED chip and the first electrode of the third LED chip are spaced apart from each other with at least a part of the second pad being flanked by these first electrodes.

6. The LED module according to claim 5, wherein a distance between the first electrode of the second LED chip and the first electrode of the third LED chip is shorter than a distance between the second electrode of the second LED chip and the second electrode of the third LED chip.

7. The LED module according to claim 1, wherein the first LED chip is configured to emit red light, the second LED chip is configured to emit blue light, and the third LED chip is configured to emit green light.

8. The LED module according to claim 1, wherein the second pad is rectangular.

9. The LED module according to claim 1, wherein the triangle is an isosceles triangle.

10. The LED module according to claim 4, wherein the second surface of each of the second LED chip and the third LED chip faces the continuous flat principal surface of the module substrate.

11. The LED module according to claim 4, further comprising a second wire and a third wire connected to the first electrode and the second electrode of the second LED chip, respectively, wherein each of the second wire and the third wire extends away from the first wire.

12. The LED module according to claim 11, further comprising a fourth wire and a fifth wire connected to the first electrode and the second electrode of the third LED chip, respectively, wherein each of the fourth wire and the fifth wire extends away from the first wire.

13. The LED module according to claim 12, wherein the second wire and the third wire are nonparallel to each other as in plan view, and the fourth wire and the fifth wire are nonparallel to each other as in plan view.

14. The LED module according to claim 4, wherein the first surface of each of the second LED chip and the third LED chip faces to the continuous flat principal surface of the module substrate.

15. The LED module according to claim 14, further comprising a third pad and a fourth pad both provided on the continuous flat principal surface of the module substrate, wherein the third pad and the fourth pad are connected to the first electrode and the second electrode of the second LED chip, respectively.

16. The LED module according to claim 15, further comprising a fifth pad and a sixth pad both provided on the continuous flat principal surface of the module substrate, wherein the fifth pad and the sixth pad are connected to the first electrode and the second electrode of the third LED chip, respectively.

17. The LED module according to claim 16, wherein each of the third pad, the fourth pad, the fifth pad and the sixth pad is rectangular.

18. The LED module according to claim 17, wherein each of the third pad, the fourth pad, the fifth pad and the sixth pad is elongated in a direction in which the second LED chip and the third LED chip are spaced apart from each other.

19. The LED module according to claim 18, wherein a distance between the third pad and the fourth pad is equal to a distance between the fifth pad and the sixth pad, while also being shorter than the distance between the first pad and the second pad.

20. An LED module comprising:
a support member;
a first electrode having a portion formed on the support member;
an LED chip disposed on an obverse surface of the support member and electrically connected to the first electrode, the LED chip being rectangular in plan view;
a second electrode having a portion formed on the support member, the second electrode being spaced apart from the first electrode; and
a wire that electrically connects the LED chip and the second electrode each other,
wherein the first electrode includes a first protrusion, a second protrusion, a third protrusion and a fourth protrusion, the first protrusion and the second protrusion extending in mutually opposite directions along a first diagonal line of the LED chip in plan view, the third protrusion and the fourth protrusion extending in mutually opposite directions along a second diagonal line of the LED chip in plan view, the first diagonal line and the second diagonal line crossing each other,
in plan view the LED chip has a first vertex and a second vertex that are spaced apart from each other along the first diagonal line, the first vertex being closer to the first protrusion than is the second vertex,
the first electrode further includes a strip portion directly connected to the second protrusion at a point of intersection of the first diagonal line with a peripheral edge of the second protrusion,
a part of the first protrusion and a part of the third protrusion face the second electrode in plan view, and the wire extends, in plan view, between the first protrusion and the third protrusion and toward the second electrode.

21. The LED module according to claim 20, wherein the first electrode includes a section that is connected to the second protrusion via the strip portion, the section of the first electrode extending to a periphery of the support member in plan view.

22. The LED module according to claim 21, wherein the section of the first electrode extends via the periphery of the support member onto the reverse surface of the support member.

23. The LED module according to claim 20, wherein the second electrode extends to a periphery of the support member in plan view.

24. The LED module according to claim 23, wherein the second electrode extends via the periphery of the support member onto the reverse surface of the support member.

25. The LED module according to claim 20, wherein the first diagonal line is perpendicular to the second diagonal line.

26. The LED module according to claim 20, wherein the first electrode includes a center portion to which the first, the second, the third and the fourth protrusions are connected in common.

27. The LED module according to claim 26, wherein the LED chip overlaps with the center portion in plan view.

28. The LED module according to claim 27, wherein the wire has an end attached to the LED chip, and said end of the wire overlaps with the center portion in plan view.

29. The LED module according to claim 26, wherein the first protrusion and the fourth protrusion are generally symmetrical to each other in plan view with respect to a virtual straight line extending through the center portion.

30. The LED module according to claim 20, wherein the section of the first electrode includes a bifurcate portion disposed apart from the LED chip.

31. The LED module according to claim 20, wherein the second electrode includes: a wire-bonding portion to which an end of the wire is attached; and a constriction connected to the wire-bonding portion.

32. The LED module according to claim 20, wherein the first electrode includes a non-straight peripheral edge that connects the first protrusion and the fourth protrusion to each other directly.

33. The LED module according to claim 20, wherein the strip portion is constant in width and extends longitudinally in parallel to the wire in plan view.

34. A light-emitting module comprising:
a substrate including a first surface, a first edge, a second edge, a third edge and a fourth edge, the first edge and the second edge facing each other as viewed in a first direction perpendicular to the first surface, the third edge and the fourth edge facing each other as viewed in the first direction and being perpendicular to the first edge;
a first electrode formed on the first surface and including a portion overlapping with a part of the first edge as viewed in the first direction;
a second electrode formed on the first surface and including a first portion overlapping with a part of the second edge and a part of the third edge as viewed in the first direction;
a third electrode formed on the first surface and including a second portion overlapping with a part of the first edge and a part of the third edge as viewed in the first direction;

a fourth electrode formed on the first surface and including a portion overlapping with a part of the second edge and a part of the fourth edge as viewed in the first direction;
a first light-emitting element electrically connected to the first electrode;
a second light-emitting element electrically connected to the second electrode and the third electrode;
a third light-emitting element electrically connected to the fourth electrode;
a first wire connected to the first light-emitting element;
a second wire connecting the second light-emitting element and the second electrode;
a third wire connecting the second light-emitting element and the third electrode; and
a fourth wire connecting the third light-emitting element and the fourth light-emitting element,
wherein the first electrode, the second electrode, the third electrode and the fourth electrode are spaced apart from each other,
the second light-emitting element overlaps with the third light-emitting element as viewed in a second direction parallel to the first edge,
the first light-emitting element is disposed between the second light-emitting element and the third light-emitting element as viewed in a third direction parallel to the third edge, and the first light-emitting element has a center, as viewed in the first direction, that is disposed offset with respect to the second light-emitting element and the third light-emitting element in the third direction.

35. The light-emitting module according to claim 34, wherein the third wire and the fourth wire are non-parallel to the second edge.

36. The light-emitting module according to claim 34, wherein each of the first edge and the second edge is longer than each of the third edge and the fourth edge.

37. The light-emitting module according to claim 34, wherein the first wire includes an end overlapping with the center of the first light-emitting element as viewed in the first direction.

38. The light-emitting module according to claim 34, further comprising a fifth electrode that is formed on the first surface and includes a portion overlapping with a part of the fourth edge as viewed in the first direction.

39. The light-emitting module according to claim 38, further comprising a fifth wire electrically connected to the third light-emitting element.

40. The light-emitting module according to claim 34, wherein the first light-emitting element is disposed on a part of the first electrode.

41. The light-emitting module according to claim 40, wherein said part of the first electrode includes a portion not overlapping with the first light-emitting element as viewed in the first direction.

42. The light-emitting module according to claim 34, wherein the first portion of the second electrode is arcuate, the second electrode further includes a first protrusion and a first strip portion that connects the first portion of the second electrode and the first protrusion to each other, and the second wire has an end attached to the first protrusion.

43. The light-emitting module according to claim 42, wherein the second portion of the third electrode is arcuate, the third electrode further includes a second protrusion and a second strip portion that connects the second portion of the third electrode and the second protrusion to each other, and the first protrusion and the second protrusion face each other as viewed in the third direction.

44. The light-emitting module according to claim 43, wherein the third wire has an end attached to the second protrusion.

45. The light-emitting module according to claim 34, wherein the second wire has a first end attached to the second light-emitting element, the third wire has a second end attached to the second light-emitting element, and the second end is disposed offset with respect to the first end in the second direction.

46. The light-emitting module according to claim 45, wherein the second end is closer to the first edge in the third direction than is the first end.

47. The light-emitting module according to claim 39, wherein the fifth wire has a first end and a second end opposite to the first end, the first end being attached to the third light-emitting element, and the second end is closer to the first edge in the third direction than is the first end.

48. The light-emitting module according to claim 47, wherein the second end of the fifth wire is attached to the fifth electrode.

* * * * *